(12) United States Patent
Chang

(10) Patent No.: US 8,179,506 B2
(45) Date of Patent: May 15, 2012

(54) METHOD FOR FABRICATING A PIXEL STRUCTURE AND THE PIXEL STRUCTURE

(75) Inventor: Hsi-Ming Chang, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 958 days.

(21) Appl. No.: 12/183,056

(22) Filed: Jul. 30, 2008

(65) Prior Publication Data
US 2009/0302318 A1 Dec. 10, 2009

(30) Foreign Application Priority Data
Jun. 10, 2008 (TW) .............................. 97121567 A

(51) Int. Cl.
*G02F 1/1335* (2006.01)
(52) U.S. Cl. .......................................... 349/114; 349/43
(58) Field of Classification Search ........................ None
See application file for complete search history.

(56) References Cited

U.S. PATENT DOCUMENTS
2006/0139526 A1  6/2006  Ahn et al.

FOREIGN PATENT DOCUMENTS
CN  1992236  7/2007
CN  101021656  8/2007

OTHER PUBLICATIONS
"1st Office Action of China counterpart application", issued on May 12, 2010, p. 1-p. 4.

*Primary Examiner* — Lucy Chien
(74) *Attorney, Agent, or Firm* — Jianq Chyun IP Office

(57) ABSTRACT

A transparent conductive layer and a first conductive layer are formed. A first photoresist layer having a first part and a second part with different thicknesses is as a mask to remove a portion of the first conductive layers to form a composite gate, and expose the transparent conductive layer of the pixel transmissive area and a portion of the transparent conductive layer in the pixel reflective area. The first photoresist layer is removed. A gate insulating layer and a semiconductor layer are formed. A second photoresist layer having a third part and a fourth part with different thicknesses is taken as a mask to remove a portion of the semiconductor layer and the gate insulating layer to form a contact opening and a channel layer. The second photoresist layer is removed. A patterned second conductive layer comprising a drain, a source and a reflective pattern is formed.

6 Claims, 15 Drawing Sheets

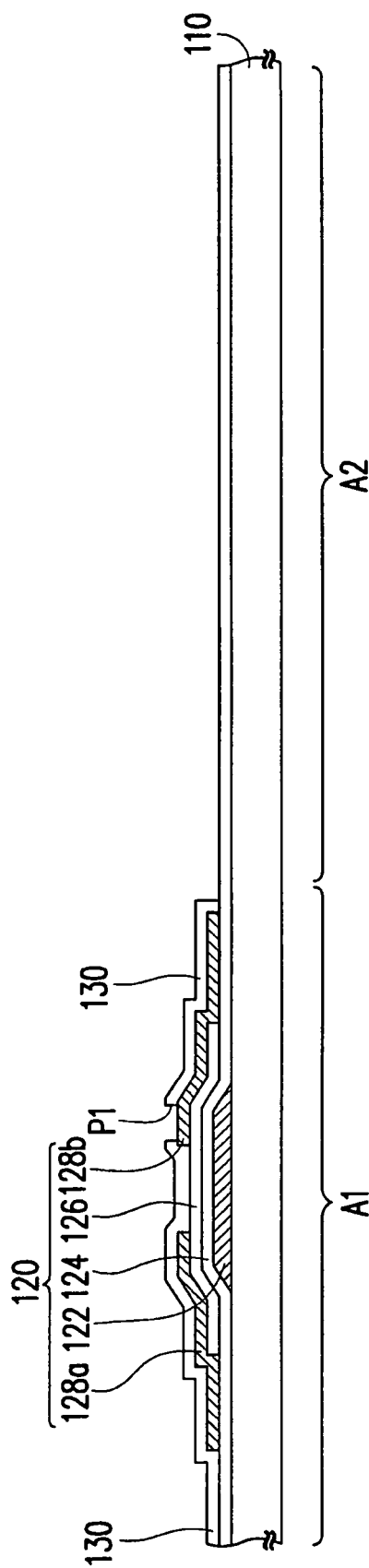
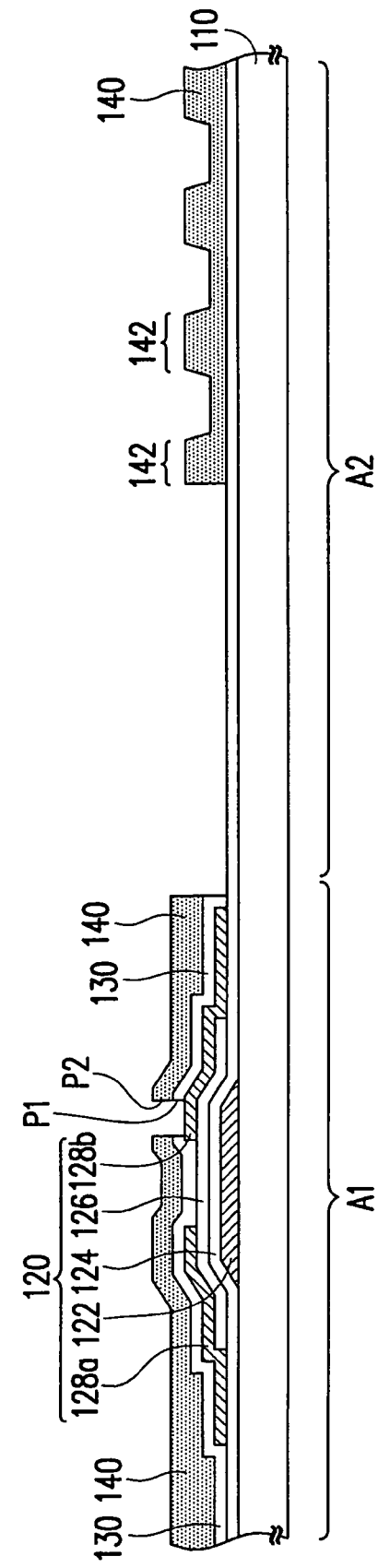
FIG. 1A (PRIOR ART)
FIG. 1B (PRIOR ART)

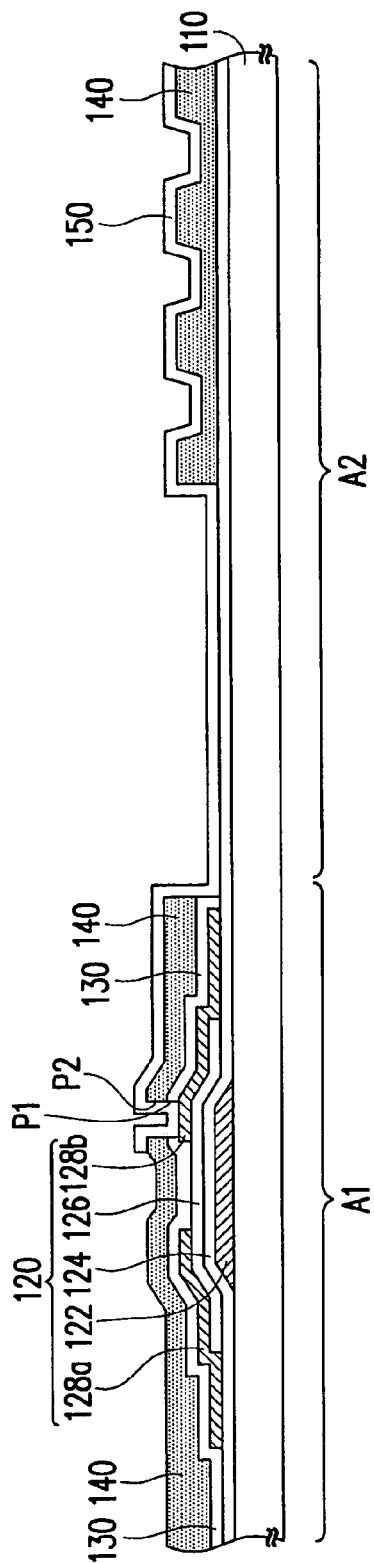
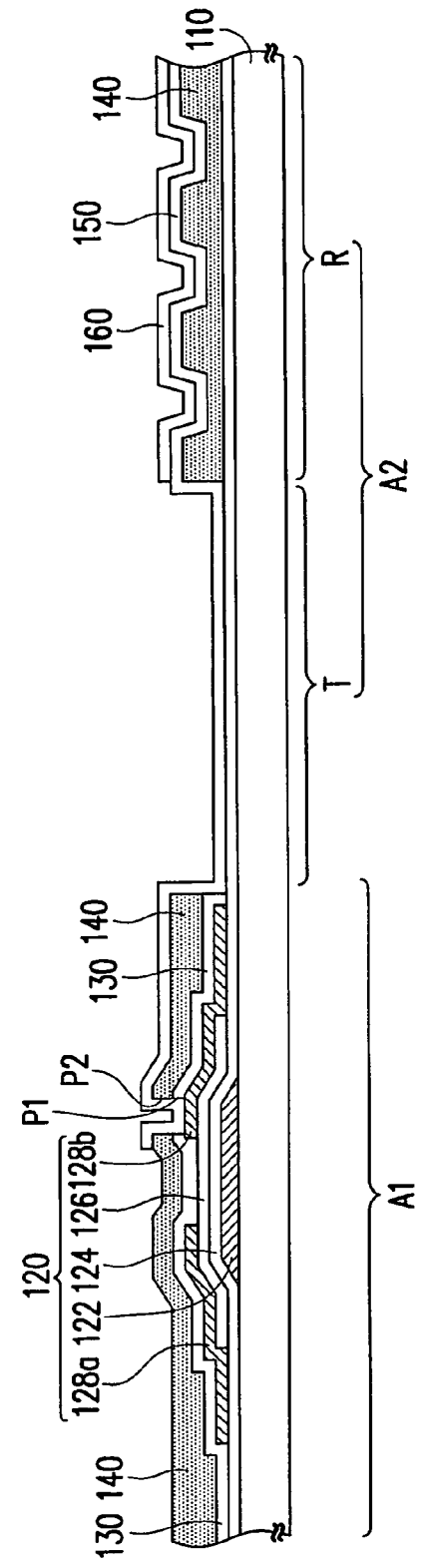
FIG. 1C (PRIOR ART)
FIG. 1D (PRIOR ART)

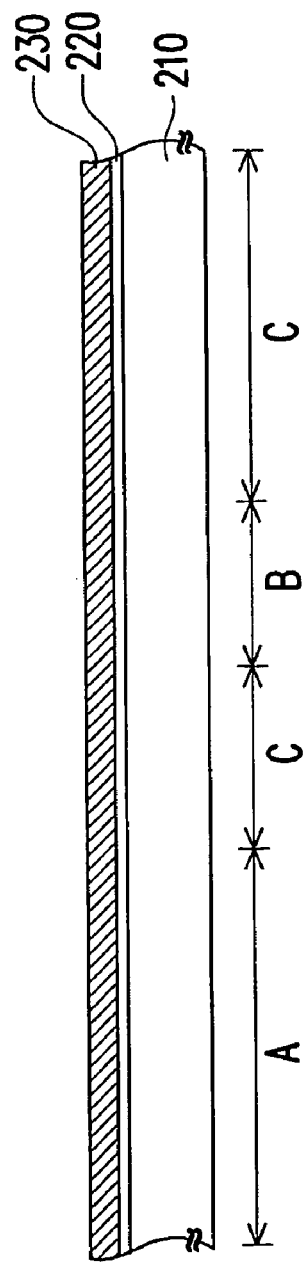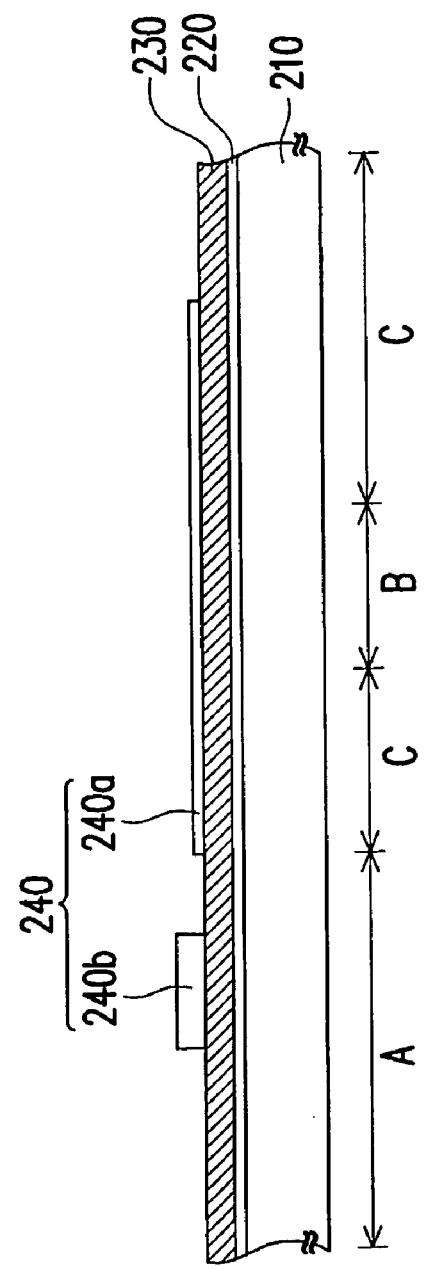
FIG. 2A
FIG. 2B

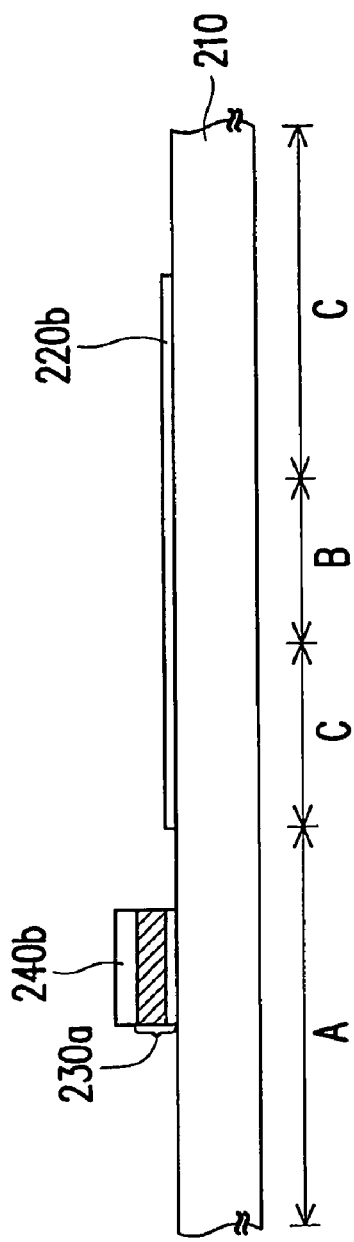
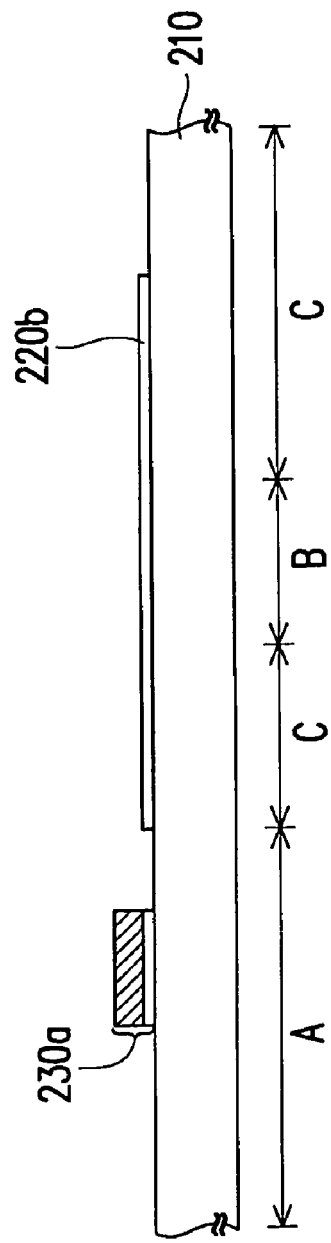
FIG. 2E
FIG. 2F

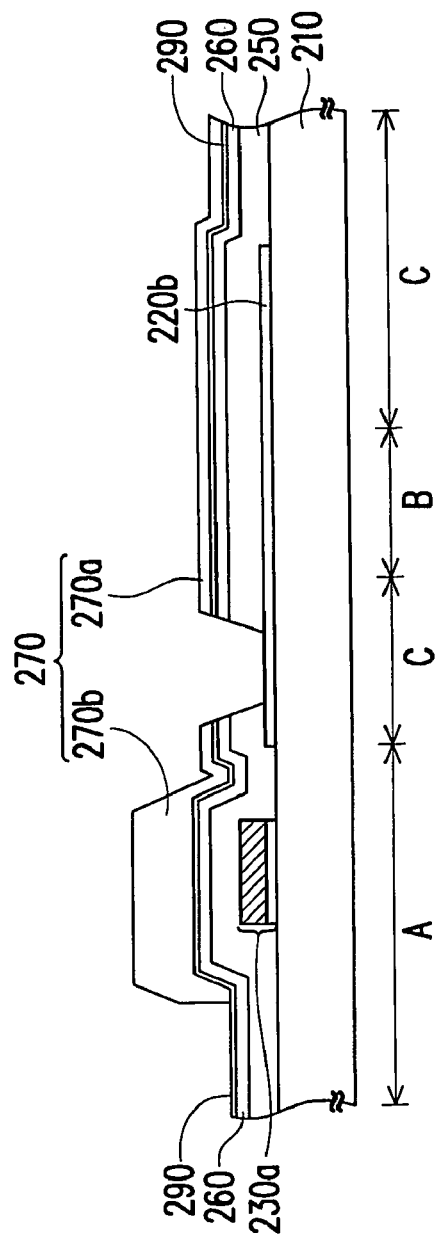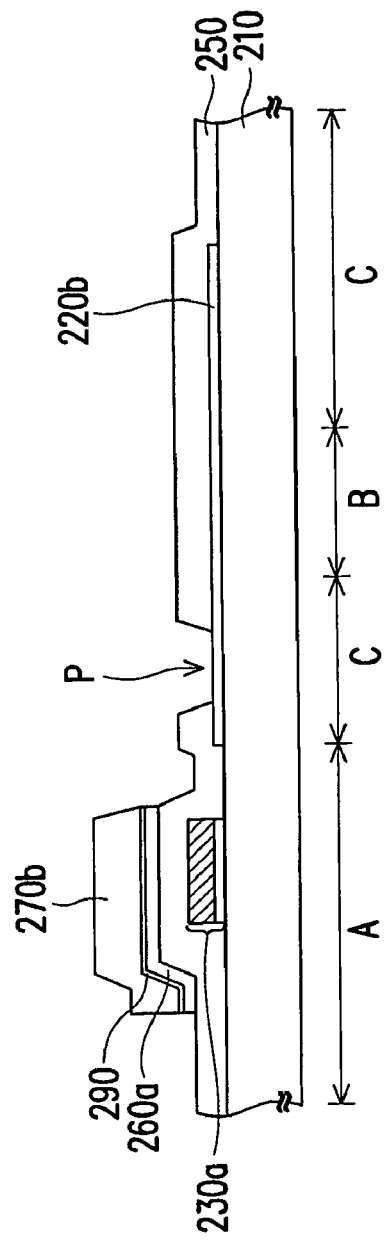

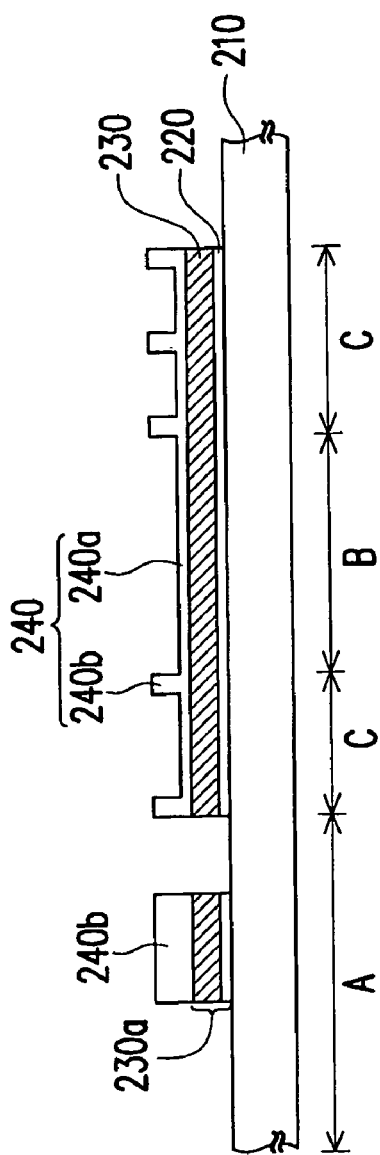
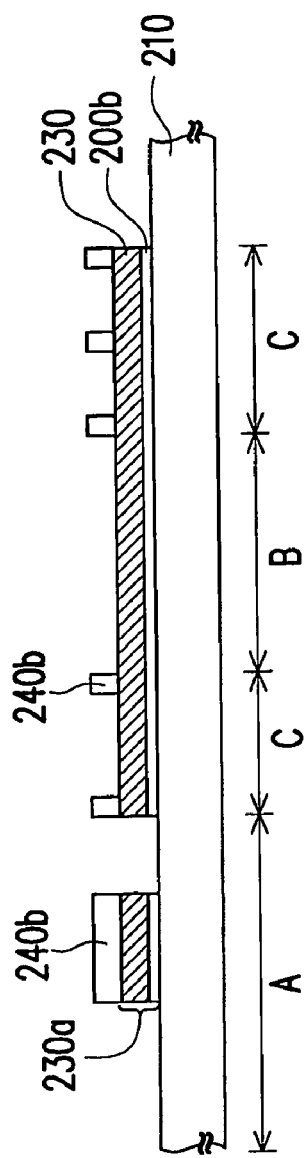
FIG. 3C
FIG. 3D

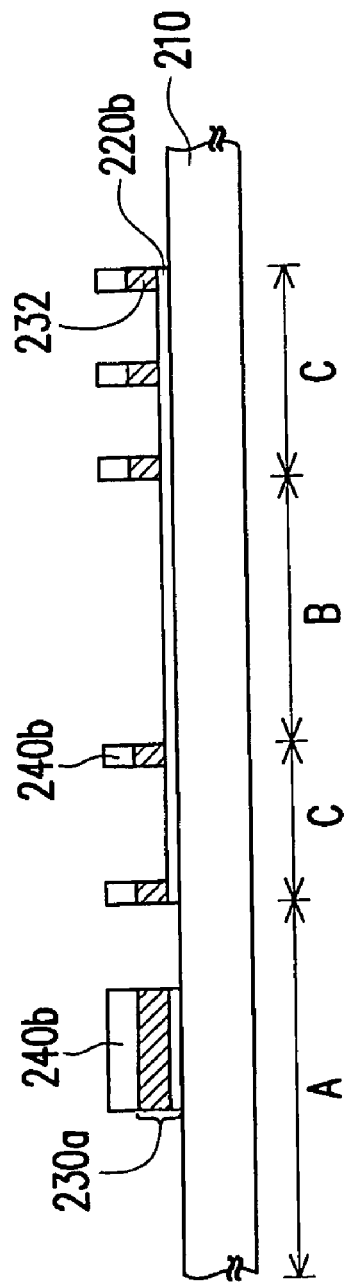
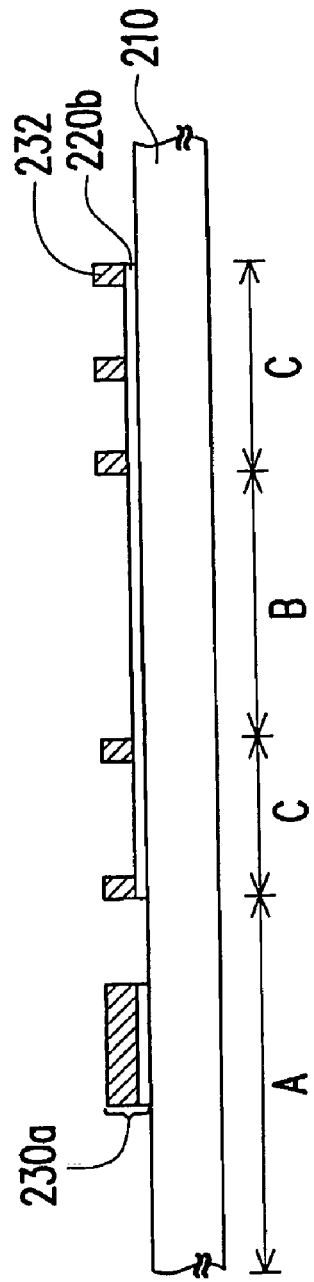

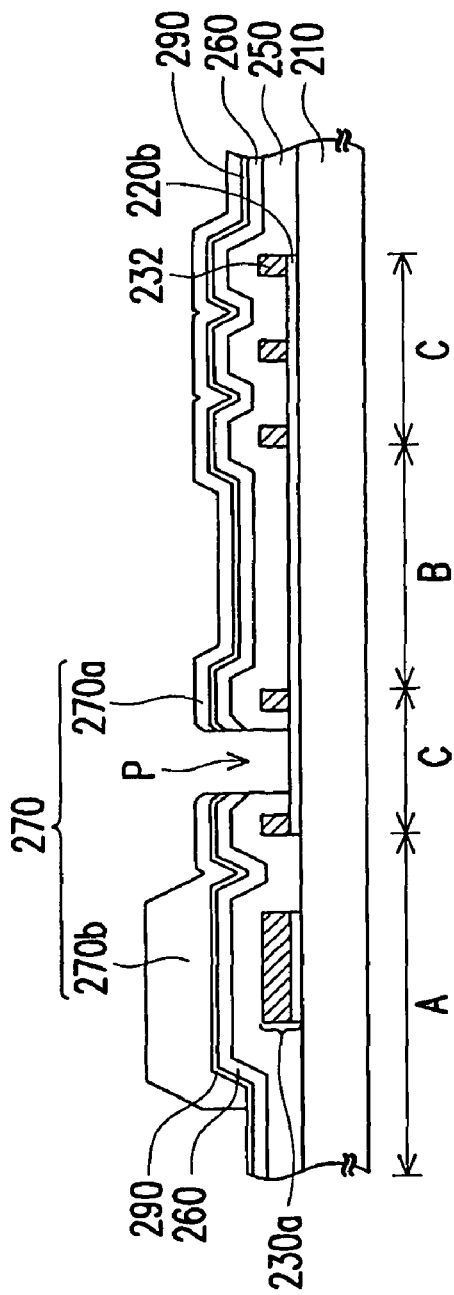
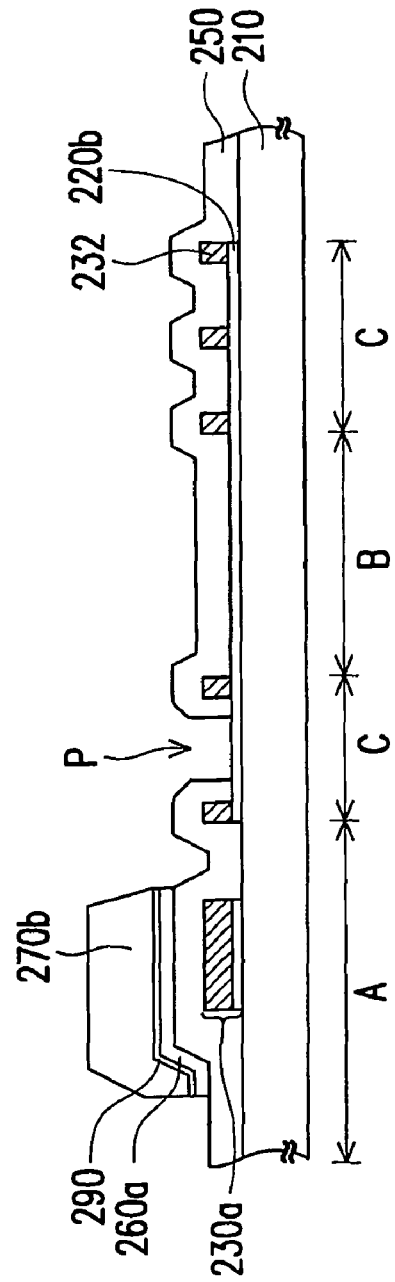

METHOD FOR FABRICATING A PIXEL STRUCTURE AND THE PIXEL STRUCTURE

CROSS-REFERENCE TO RELATED APPLICATION

This application claims the priority benefit of Taiwan application serial no. 97121567, filed Jun. 10, 2008. The entirety of the above-mentioned patent application is hereby incorporated by reference herein and made a part of this specification.

BACKGROUND OF THE INVENTION

1. Field of the Invention

The present invention relates to a method for fabricating a pixel structure and a pixel structure thereof. More particularly, the present invention relates to a method for fabricating a transflective pixel structure via three mask processes, and a pixel structure thereof.

2. Description of Related Art

Recently, with development of photoelectric technology and semiconductor manufacturing technology, flat panel displays (FPDs) are developed accordingly, in which since a liquid crystal display (LCD) has advantages of low voltage operation, no radiation, light weight, small size, etc., it is widely applied to a plurality of portable electronic devices such as laptop computers, mobile phones, personal digital assistants, etc.

However, for a general transmissive LCD applied to the aforementioned portable devices, if it is used outdoors or in an environment with strong external light source, images displayed on the LCD cannot be viewed clearly due to the excessive strong external light source. Therefore, a transflective LCD is generally applied to, which may not only utilize its own backlight source, but may also utilize an environmental light source to provide a reflective light source, so as to increase a luminance of the LCD. Therefore, the transflective LCD not only has the advantage of workable under a strong light, but may also effectively utilize the environmental light source as the backlight source for saving energy.

FIG. 1A to FIG. 1D are diagrams illustrating a fabrication flowchart of a transflective LCD. First, referring to FIG. 1A, a substrate 110 is provided, wherein the substrate 110 has an active device area A1 and a pixel area A2. Next, a gate 122, a gate insulating layer 124, a channel layer 126, a source 128a and a drain 128b are sequentially formed to form a thin-film transistor 120. Next, a patterned passivation layer 130 is formed to cover the thin-film transistor 120. According to FIG. 1A, the patterned passivation layer 130 has a contact opening P1, and the contact opening P1 is used for exposing the drain 128b of the thin-film transistor 120. Until now, the fabrication method is approximately the same to the fabrication method of a pixel structure of a transmissive LCD. It should be noted that the aforementioned structure generally requires four mask processes.

Next, referring to FIG. 1B, a patterned dielectric layer 140 is formed on the substrate 110 to cover the patterned passivation layer 130, and a portion of surface of the patterned dielectric layer forms a plurality of bumps 142. In detail, the steps of forming the patterned dielectric layer 140 are as follows. First, a dielectric material (not shown) is first deposited on the substrate 110, and the dielectric material (not shown) is a photosensitive material. Next, a photolithographic process is performed to the dielectric material (photosensitive material) via a mask process, so as to form the patterned dielectric layer 140. According to FIG. 1B, the patterned dielectric layer 140 has a contact opening P2 located above the drain 128b for exposing the drain 128b.

Next, referring to FIG. 1C, a pixel electrode 150 is formed on the substrate 110. Generally, the fabrication method of the pixel electrode 150 includes following steps. First, a transparent conductive material (not shown) is formed to cover the patterned dielectric layer 140. Next, the transparent conductive material (not shown) is patterned via a mask process, so as to form the pixel electrode 150. It should be noted that the pixel electrode 150 is electrically connected to the drain 128b via the contact opening P2.

Next, referring to FIG. 1D, a patterned reflective layer 160 is formed on the pixel electrode 150. In detail, the steps of forming the patterned reflective layer 160 are as follows. First, a reflective layer material (not shown) is first deposited on the pixel electrode 150. Next, the reflective layer material (not shown) is patterned via a mask process, so as to form the patterned reflective layer 160. A region wherein the patterned reflective layer 160 is located is defined to be a reflective area R, and a region without the patterned reflective layer 160 on the pixel electrode 150 is defined to be a transmissive area T.

Compared to a general transmissive LCD requiring 5 mask processes, the transflective LCD requires 7 mask processes, so that fabrication time and cost are higher compared to that of the transmissive LCD. Therefore, reduction of number of the mask processes is a general trend in development of the transflective LCD.

SUMMARY OF THE INVENTION

The present invention is directed to a method for fabricating a pixel structure, which may reduce the number of the utilized masks.

The present invention is directed to a pixel structure fabricated based on the above method, by which the fabrication cost and fabrication time can be effectively reduced.

The present invention is directed to a pixel structure fabricated based on the above method, which has a preferred quality and production yield.

The present invention provides a method for fabricating a pixel structure. The method can be described as follows. First, a substrate is provided, wherein the substrate includes an active device area, a pixel transmissive area and a pixel reflective area. Next, a transparent conductive layer and a first conductive layer are sequentially formed on the substrate. Thereafter, a first photoresist layer having a first part and a second part is formed on the first conductive layer, wherein the thickness of the first part and the thickness of the second part are different. Next, a portion of the first conductive layer and the transparent conductive layer is removed by using the first photoresist layer as a mask, so as to form a composite gate in the active device area. Next, the first part of the first photoresist layer is removed to expose the first conductive layer located at the pixel transmissive area and a portion or all of the first conductive layer located at the pixel reflective area. Next, the exposed first conductive layer is removed by using the second part of the first photoresist layer as the mask, so as to expose the transparent conductive layer in the pixel transmissive area and a portion or all of the transparent conductive layer in the pixel reflective area. Next, the second part of the first photoresist layer is removed. Thereafter, a gate insulating layer and a semiconductor layer are sequentially formed on the substrate. Next, a second photoresist layer having a third part and a fourth part is formed on the semiconductor layer, wherein the thickness of the third part and the thickness of the fourth part are different. Next, a portion of the semiconductor layer and the gate insulating layer is removed by using the second photoresist layer as the mask, so as to form a contact opening and expose a portion of the transparent conductive layer. Next, the third part of the second photoresist layer is removed to expose the semiconductor layer located at the pixel reflective area and the pixel transmissive area. Thereafter, the exposed semiconductor layer is removed, and the semiconductor layer located at the active device area is remained to serve as a channel layer. Next, the fourth part of the second photoresist layer is removed. Thereafter, a patterned second conductive layer comprising a source, a drain and a reflective pattern is formed on the substrate, wherein the source and the drain is located above the channel layer, and the reflective pattern is located above the transparent conductive layer of the pixel reflective area.

In an embodiment of the present invention, in the step of removing the exposed first conductive layer by using the second part of the first photoresist layer as the mask, the transparent conductive layer in the pixel transmissive area and all of the transparent conductive layer in the pixel reflective area are exposed.

In an embodiment of the present invention, in the step of removing the exposed first conductive layer by using the second part of the first photoresist layer as the mask, the transparent conductive layer in the pixel transmissive area and a portion of the transparent conductive layer in the pixel reflective area are exposed, and the remained first conductive layer in the pixel reflective area can form a plurality of bumps.

In an embodiment of the present invention, the first photoresist layer and the second photoresist layer are formed with a half-tone mask process or a gray-tone mask process.

In an embodiment of the present invention, the first photoresist layer and the second photoresist layer include a positive photoresist.

In an embodiment of the present invention, the first part of the first photoresist layer and the third part of the second photoresist layer are removed with an ashing process.

In an embodiment of the present invention, the method of forming the transparent conductive layer includes forming an indium tin oxide (ITO) layer, an indium zinc oxide (IZO) layer or an aluminium zinc oxide (AZO) layer via a sputtering process.

In an embodiment of the present invention, the method for fabrication the pixel structure further includes following steps. First, an ohmic contact layer is formed on the semiconductor layer. Next, the ohmic contact layer between the source and the drain is removed by using the patterned second conductive layer as the mask.

The present invention provides a pixel structure disposed on a substrate, wherein the substrate includes an active device area, a pixel transmissive area and a pixel reflective area. The pixel structure includes a patterned transparent conductive layer, a patterned first conductive layer, a gate insulating layer, a channel layer and a patterned second conductive layer. The patterned transparent conductive layer is located in the active device area, the pixel transmissive area and the pixel reflective area of the substrate. The patterned first conductive layer is disposed on the patterned transparent conductive layer in the active device area, and the patterned first conductive layer and the patterned transparent conductive layer in the active device area form a composite gate. The gate insulating layer covers the patterned transparent conductive layer and the patterned first conductive layer, and has a contact opening. The channel layer is disposed on the gate insulating layer located above the composite gate. The patterned second conductive layer includes a source, a drain and a reflective pattern, wherein the source and the drain are disposed on the channel layer, and the reflective pattern is disposed on the gate insulating layer of the pixel reflective area, wherein the drain is electrically connected to the patterned transparent conductive layer via the contact opening.

In an embodiment of the present invention, the patterned first conductive layer further includes a plurality of bumps disposed on the patterned transparent conductive layer in the pixel reflective area.

In an embodiment of the present invention, the material of the transparent conductive layer includes one of ITO, IZO and AZO.

In an embodiment of the present invention, the material of the semiconductor layer includes one of amorphous silicon and poly silicon.

In an embodiment of the present invention, the material of the gate insulating layer includes one of silicon oxide, silicon nitride and organic material.

In an embodiment of the present invention, the pixel structure further includes an ohmic contact layer disposed between the source/drain and the channel layer.

The present invention provides another pixel structure disposed on a substrate, wherein the substrate includes an active device area, a pixel transmissive area and a pixel reflective area. The pixel structure includes a thin-film transistor, a transparent pixel electrode and a reflective pixel electrode. The thin-film transistor is disposed in the active device area of the substrate, wherein the thin-film transistor includes a gate, a channel layer, a source and a drain. The transparent pixel electrode is disposed on a surface of the substrate and is located at the pixel transmissive area and the pixel reflective area, and the transparent pixel electrode is electrically connected to the drain. The reflective pixel electrode is disposed in the pixel reflective area, and covers the transparent pixel electrode, wherein the reflective pixel electrode and the source and the drain are the same film layer.

In an embodiment of the present invention, the pixel structure further includes a plurality of bumps disposed between the transparent pixel electrode and the reflective pixel electrode.

In an embodiment of the present invention, the gate includes a transparent conductive layer and a conductive layer.

In the present invention, the first and the second photoresist layers respectively have parts with different thicknesses, and the photoresist layers are taken as the mask for patterning the film layers, so that fabrication of the pixel structure can be implemented via only three mask processes. Therefore, the fabrication cost and the fabrication time can be effectively reduced, and the productivity and production yield can be greatly improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1D are diagrams illustrating a fabrication flowchart of a transflective LCD.

FIG. 2A to FIG. 2M are diagrams illustrating a fabrication flowchart of a pixel structure according to an embodiment of the present invention.

FIG. 3A to FIG. 3L are diagrams illustrating a pixel structure according to another embodiment of the present invention.

DESCRIPTION OF EMBODIMENTS

Figure 2C:
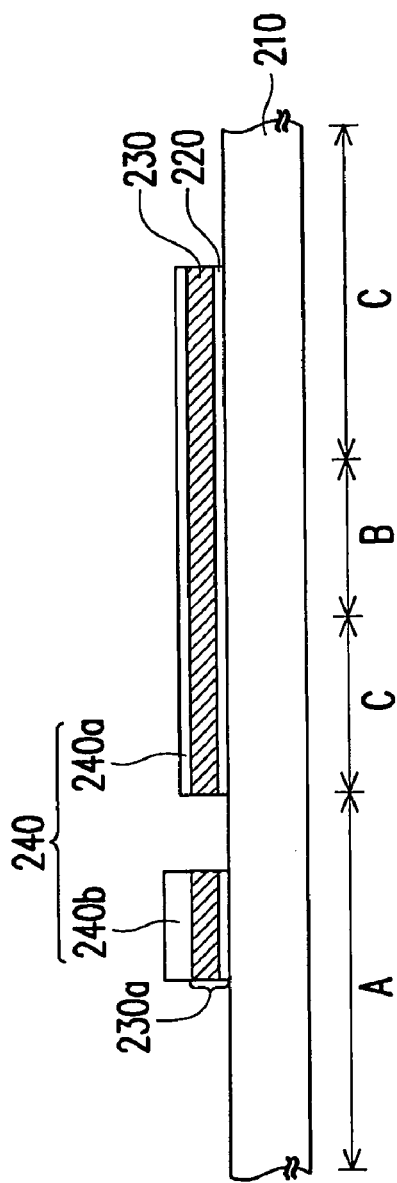

Generally, a pixel structure may have an ability of reflecting lights if a reflective pixel electrode is applied in the pixel structure, and if a transparent pixel electrode is simultaneously disposed in the pixel structure at an area outside the reflective pixel electrode, the pixel structure then simultaneously has a transmissive display mode and a reflective display mode. According to the description of the related art, fabrication of such kind of pixel structure requires 7 mask processes, so that not only fabrication cost and fabrication time thereof are wasted, but also a production yield thereof cannot be improved due to the complicated fabrication process. Therefore, the present invention provides a method for fabricating the pixel structure, and a pixel structure thereof, so as to fabricate the pixel structure with a good quality based on a simplified fabrication process. In the following content, embodiments are provided for detailed description.

First Embodiment

FIG. 2A to FIG. 2M are diagrams illustrating a fabrication flowchart of a pixel structure according to an embodiment of the present invention. First, referring to FIG. 2A, a substrate 210 is provided, wherein the substrate 210 has an active device area A, a pixel transmissive area B and a pixel reflective area C. In the present embodiment, the pixel reflective area C surrounds the pixel transmissive area B. However, the pixel reflective area C and the pixel transmissive area B can also be rectangular areas adjacent to each other. The present invention does not limit the arrangement of the pixel reflective area C and the pixel transmissive area B. Next, a transparent conductive layer 220 and a first conductive layer 230 are sequentially formed on the substrate 210. In detail, the first conductive layer 230 can be formed by depositing conductive material on the substrate 210 via physical vapor deposition (PVD), for example. The above conductive material can be materials with a low resistance such as aluminium, gold, copper, molybdenum, chromium, titanium, aluminium alloy or molybdenum alloy, etc. Moreover, the method of forming the transparent conductive layer 220 includes forming an ITO layer, an IZO layer or an AZO layer via a sputtering process.

Next, referring to FIG. 2B, a first photoresist layer 240 is formed on the first conductive layer 230, wherein the first photoresist layer 240 has a first part 240a and a second part 240b, and the thickness of the first part 240a and the thickness of the second part 240b are different. In detail, the first photoresist layer 240 can be formed with a half-tone mask process or a gray-tone mask process. In the present embodiment, the half-tone mask or the gray-tone mask has regions with two transmissivities, so that the first photoresist layer 240 may have the first part 240a and the second part 240b with different thicknesses. The first photoresist layer 240 is a positive photoresist. Certainly, the first photoresist layer 240 can also be a negative photoresist according to a design of the mask.

Referring to FIG. 2C, a portion of the first conductive layer 230 and the transparent conductive layer 220 is removed by using the first photoresist layer 240 as the mask, so as to form a composite gate 230a in the active device area A. In detail, a portion of the first conductive layer 230 and the transparent conductive layer 220 can be removed via a dry etching process or a wet etching process.

Figure 2D:
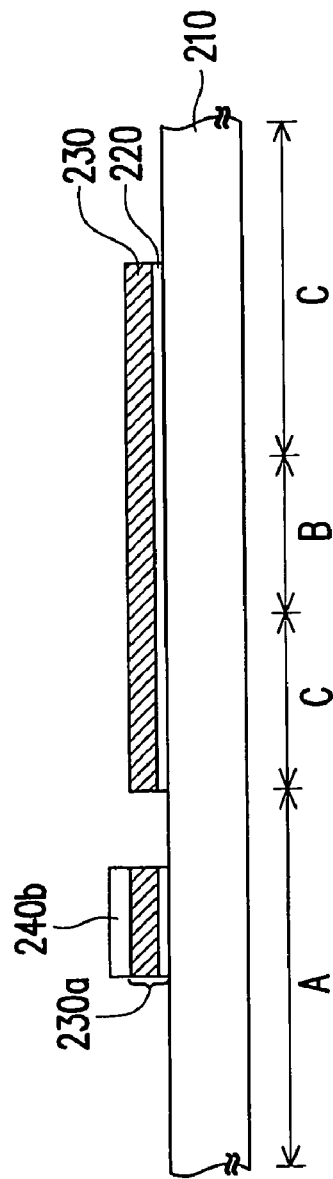

Referring to FIG. 2D, the first part 240a of the first photoresist layer 240 is removed, and the second part 240b of the first photoresist layer 240 is remained, so as to expose the first conductive layer 230 located at the pixel transmissive area B and the first conductive layer 230 located at the pixel reflective area C. Next, the second part 240b of the photoresist layer 240 is taken as an etching mask to remove the exposed first conductive layer 230, so as to expose the transparent conductive layer 220 of the pixel transmissive area B and the transparent conductive layer 220 of the pixel reflective area C, and form a transparent pixel electrode 220b in the pixel transmissive area B and the pixel reflective area C, as shown in FIG. 2E. In detail, the first part 240a of the first photoresist layer 240 can be removed via an ashing process, and then the exposed first conductive layer 230 can be removed via a dry etching, wherein the two processes can be sequentially performed within the same dry etching machine, so as to save the fabrication time. Next, the second part 240b of the first photoresist layer 240 is removed, as shown in FIG. 2F. Until now, a first mask process is completed.

Figure 2G:
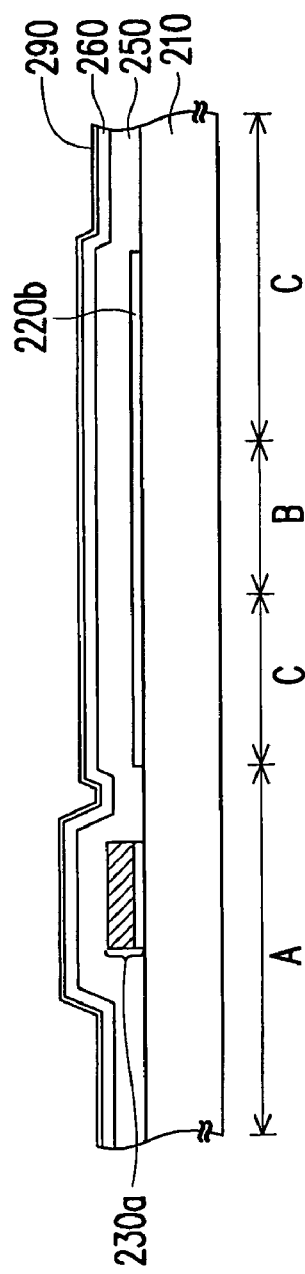

Referring to FIG. 2G, a gate insulating layer 250 and a semiconductor layer 260 are sequentially formed on the substrate 210. In detail, the material of the gate insulating layer 250 can be $SiO_2$ formed by selecting SiN, or tetraethoxysilane (TEOS) as a reaction gas source. The semiconductor layer 260 can be formed by depositing amorphous silicon on the gate insulating layer 250 via for example, CVD. Moreover, to reduce a contact resistance between the semiconductor layer and metal materials, an ohmic contact layer 290 can be formed on the semiconductor layer 260 in an actual application, and the material thereof is for example, N-type doped amorphous silicon.

Figure 2H:
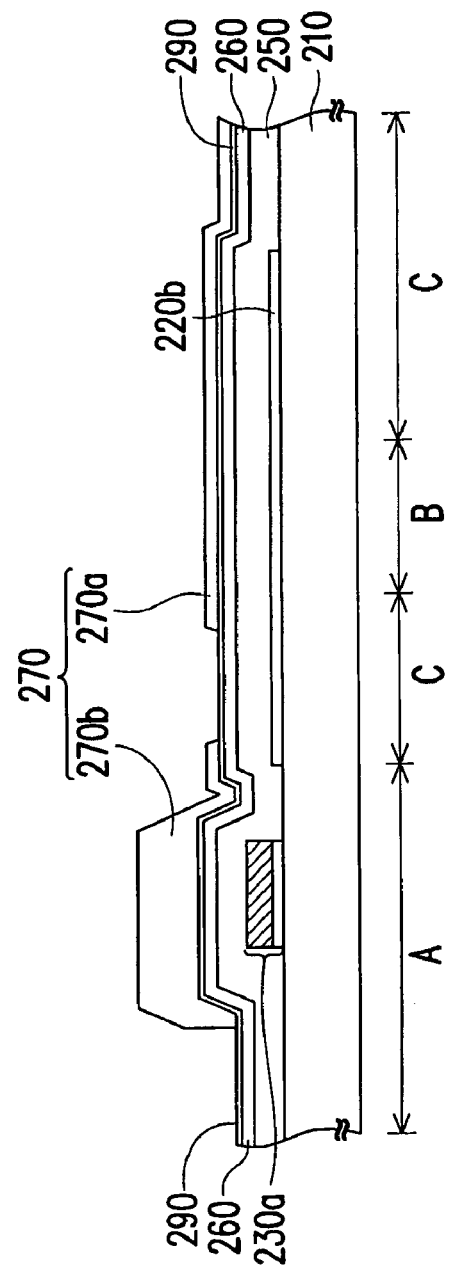

Referring to FIG. 2H, a second photoresist layer 270 is formed on the semiconductor layer 260, wherein the second photoresist layer 270 has a third part 270a and a fourth part 270b, and the thickness of the third part 270a and the thickness of the fourth part 270b are different. In detail, the second photoresist layer 270 can be formed with a half-tone mask process or a gray-tone mask process. In the present embodiment, the half-tone mask or the gray-tone mask has regions with two transmissivities, so that the second photoresist layer 270 may have the third part 270a and the fourth part 270b with different thicknesses. The second photoresist layer 270 is a positive photoresist. Certainly, the second photoresist layer 270 can also be a negative photoresist according to a design of the mask.

Referring to FIG. 2I, a portion of the semiconductor layer 260 and the gate insulating layer 250 are removed by using the second photoresist layer 270 as the mask, so as to form a contact opening P and expose a portion of the transparent conductive layer 220. In detail, a portion of the semiconductor layer 260 and the gate insulating layer 250 can be removed via the dry etching process or the wet etching process.

Figure 2K:
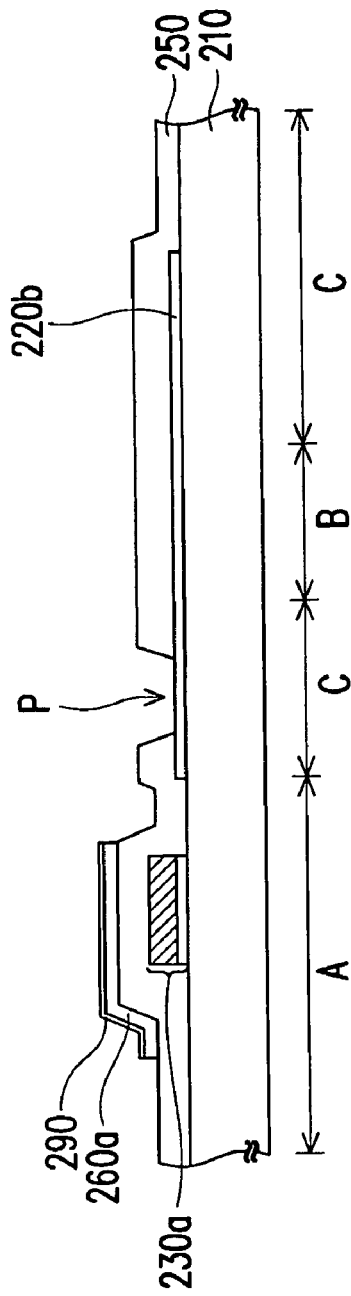

Referring to FIG. 2J, the third part 270a of the second photoresist layer 270 is removed to expose the semiconductor layer 260 located at the pixel reflective area C and the pixel transmissive area B. Next, the exposed semiconductor layer 260 is removed, and the remained semiconductor layer 260 located at the active device area A serves as a first channel layer 260a. In detail, the third part 270a of the second photoresist layer 270 can be removed via an ashing process, and then the exposed semiconductor layer 260 can be removed via a dry etching process, wherein the two processes can be sequentially performed within the same dry etching machine, so as to save a fabrication time thereof. Next, the fourth part 270b of the second photoresist layer 270 is removed, as shown in FIG. 2K. Until now, a second mask process is completed.

Figure 2L:
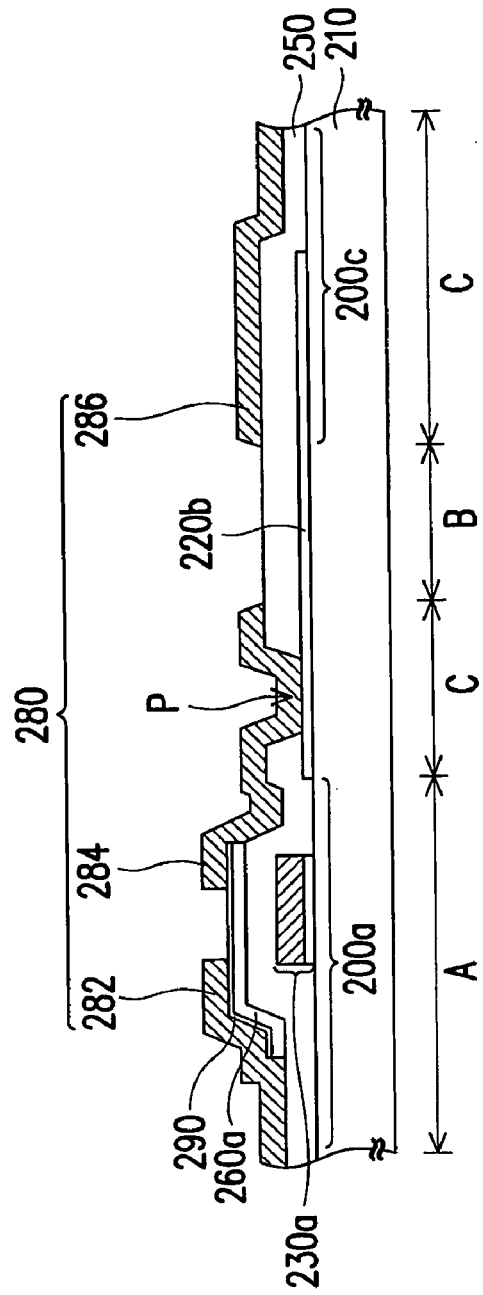

Referring to FIG. 2L, a patterned second conductive layer 280 including a source 282, a drain 284 and a reflective pattern 286 is formed on the substrate 210. The source 282 and the drain 284 are located above the channel layer 260a, and the drain 284 is electrically connected to the transparent conductive layer 220 via the contact opening P. Moreover, the reflective pattern 286 is located above the transparent conductive layer 220 in the pixel reflective area C. In detail, in the present embodiment, the patterned second conductive layer 280 not only functions as the source 282 and the drain 284, but is also formed in the pixel reflective area C to serve as the reflective pattern 286. Actually, the material of the patterned second conductive layer 280 can be Ag, Al or other conductive materials with good reflectivity and good conductivity.

Figure 2M:
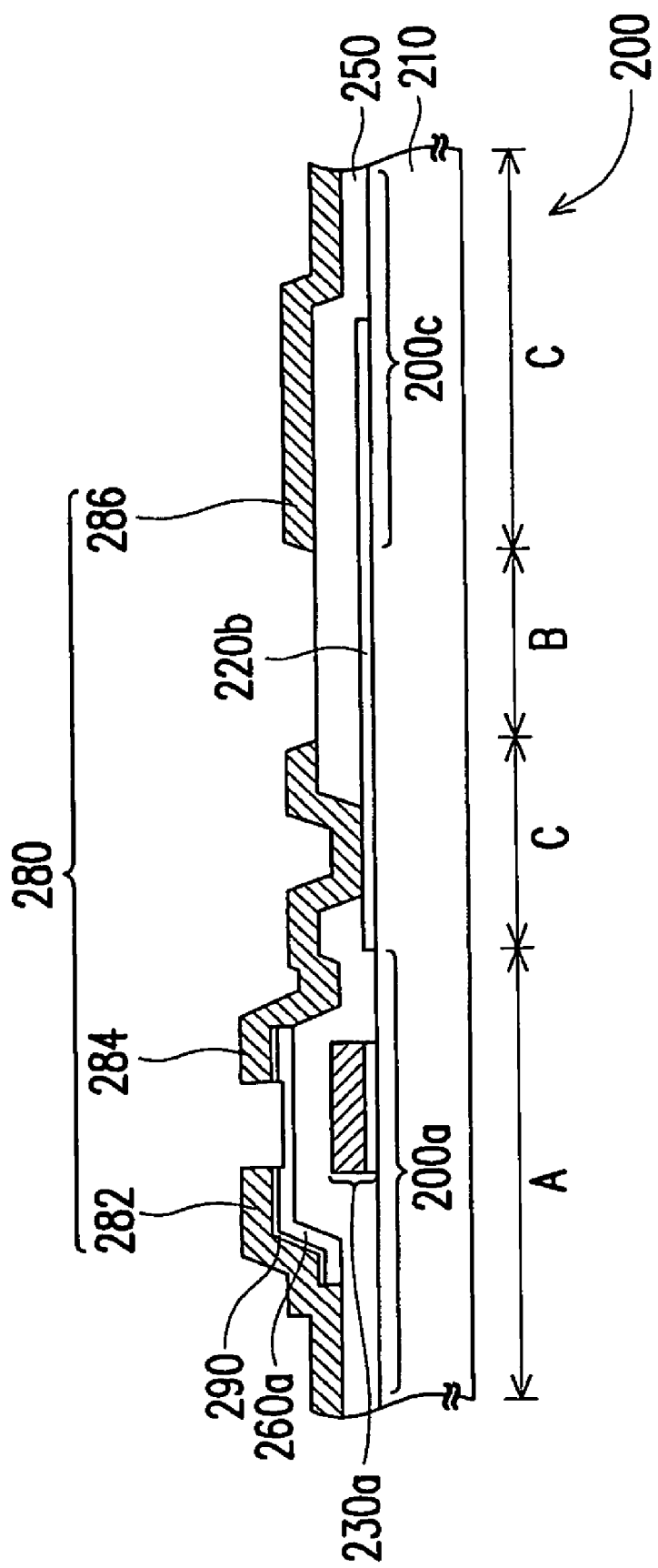

Next, Referring to FIG. 2M, since the ohmic contact layer 290 still exists between the source 282 and the drain 284, after the patterned second conductive layer 280 is formed, the patterned second conductive layer 280 is taken as the mask to remove the ohmic contact layer 290 located between the source 282 and the drain 284. Moreover, in another embodiment, after the step shown in FIG. 2M, an insulating layer (not shown) can be selectively formed to cover the active device area A, especially to cover the channel layer 260a exposed between the source 282 and the drain 284.

In summary, according to the steps shown in FIG. 2A to FIG. 2M, the transflective pixel structure 200 can be fabricated. Referring to FIG. 2L again, the pixel structure 200 is disposed on the substrate 210 including the active device area A, the pixel transmissive area B and the pixel reflective area C. The pixel structure 200 includes a thin-film transistor 200a, the transparent pixel electrode 220b and a reflective pixel electrode 200c. The thin-film transistor 200a is disposed in the active device area A of the substrate 210, and includes the composite gate 230a, the channel layer 260a, the source 282 and the drain 284. The composite gate 230a is formed by stacking the first conductive layer 230 and the transparent conductive layer 220, and the channel layer 250a is located on the gate insulating layer 250 located above the composite gate 230a. The source 282 and the drain 284 are located on the channel layer 260a, and are formed by the patterned second conductive layer 280. Moreover, the transparent pixel electrode 220b is disposed on the surface of the substrate 210 and is located at the pixel transmissive area B and the pixel reflective area C, wherein the transparent pixel electrode 229b is electrically connected to the drain 284. The reflective pixel electrode 200c is disposed in the pixel reflective area C and covers the transparent pixel electrode 220b. It should be noted that the reflective pixel electrode 200c and the source 282 and the drain 284 are the same film layer form by the patterned second conductive layer 280. By such means, additional forming of the reflective material in the reflective pixel area C is unnecessary, so as to simplify the fabrication process of the pixel structure 200. It should be noted that the aforementioned method for fabricating the pixel structure 200 only requires three mask processes to form the transflective pixel structure 200. Moreover, in another embodiment, the transflective pixel structure further includes an insulating layer (not shown) covering the active device area A, especially covering the channel layer 260a exposed between the source 282 and the drain 284.

Second Embodiment

In a general transflective LCD, to improve a reflectivity of the reflective pixel electrode, a plurality of bumps are generally disposed under the reflective electrode. Accordingly, an embodiment is provided to describe such situation, in which a plurality of the bumps is formed in the pixel reflective area for improving a display quality of the LCD.

FIG. 3A to FIG. 3L are diagrams illustrating a pixel structure according to another embodiment of the present invention. First, referring to FIG. 3A, a substrate 210 including an active device area A, a pixel transmissive area B and a pixel reflective area C is provided. Thereafter, a transparent conductive layer 220 and a first conductive layer 230 are sequentially formed on the substrate 210. The method for forming the transparent conductive layer 220 and the first conductive layer 230 is the same to that of the first embodiment, and therefore detailed description thereof will not be repeated.

Figure 3A:
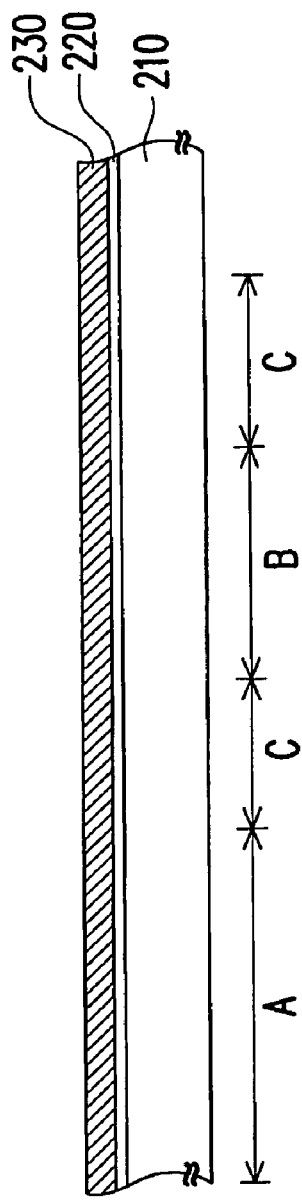
Figure 3B:
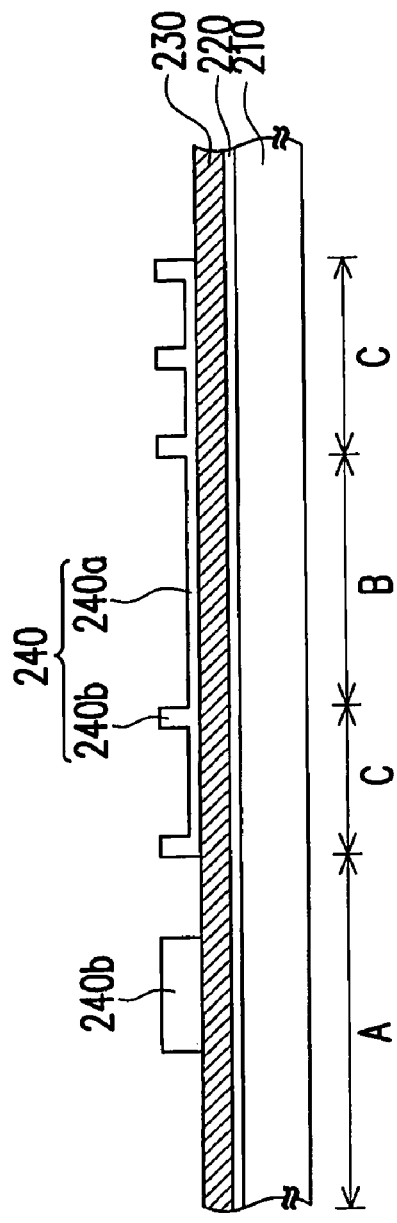

Next, referring to FIG. 3B, a first photoresist layer 240 is formed on the first conductive layer 230, wherein the first photoresist layer 240 has a first part 240a and a second part 240b, and the thickness of the first part 240a and the thickness of the second part 240b are different. In detail, the first photoresist layer 240 can be formed with a half-tone mask process or a gray-tone mask process. In the present embodiment, the half-tone mask or the gray-tone mask has regions with two transmissivities, so that the first photoresist layer 240 may have the first part 240a and the second part 240b with different thicknesses. The first photoresist layer 240 is a positive photoresist. Certainly, the first photoresist layer 240 can also be a negative photoresist according to a design of the mask. Particularly, different to the first embodiment, the first photoresist layer 240 located in the pixel reflective area C has the first part 240a and the second part 240b with different thicknesses, which can be used for forming the plurality of bumps in the follow-up fabrication process.

Referring to FIG. 3C, a portion of the first conductive layer 230 and the transparent conductive layer 220 is removed by using the first photoresist layer 240 as the mask, so as to form a composite gate 230a in the active device area A. In detail, a portion of the first conductive layer 230 and the transparent conductive layer 220 can be removed via a dry etching process or a wet etching process.

Referring to FIG. 3D, the first part 240a of the first photoresist layer 240 is removed to expose the first conductive layer 230 located at the pixel transmissive area B and the first conductive layer 230 located at the pixel reflective area C. Next, the second part 240b of the photoresist layer 240 is taken as the mask to remove the exposed first conductive layer 230, so as to expose the transparent conductive layer 220 in the pixel transmissive area B and a portion of the transparent conductive layer 220 in the pixel reflective area C, so that the remained first conductive layer in the pixel reflective area C forms a plurality of the bumps 232, as shown in FIG. 3E. In detail, the first part 240a of the first photoresist layer 240 can be removed via an ashing process, and then the exposed first conductive layer 230 can be removed via a dry etching, wherein the two processes can be sequentially performed within the same dry etching machine, so as to save the fabrication time. Next, as shown in FIG. 3F, the second part 240b of the first photoresist layer 240 is removed. Until now, the first mask process is completed.

Figure 3G:
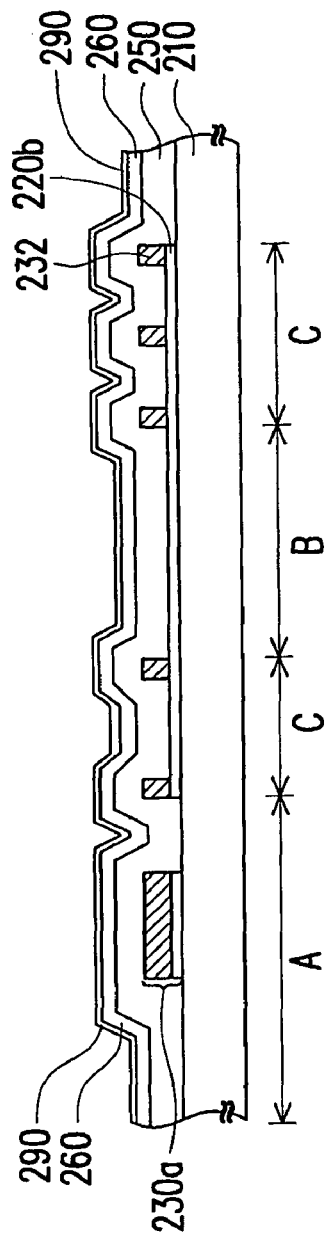

Referring to FIG. 3G, a gate insulating layer 250 and a semiconductor layer 260 are sequentially formed on the substrate 210. In detail, the material of the gate insulating layer 250 can be $SiO_2$ formed by selecting SiN, or TEOS as a reaction gas source. The semiconductor layer 260 can be formed by depositing amorphous silicon on the gate insulating layer 250 via for example, CVD. Moreover, to reduce a contact resistance between the semiconductor layer and metal materials, an ohmic contact layer 290 can be formed on the semiconductor layer 260 in an actual application, and the material thereof is for example, N-type doped amorphous silicon.

Figure 3H:
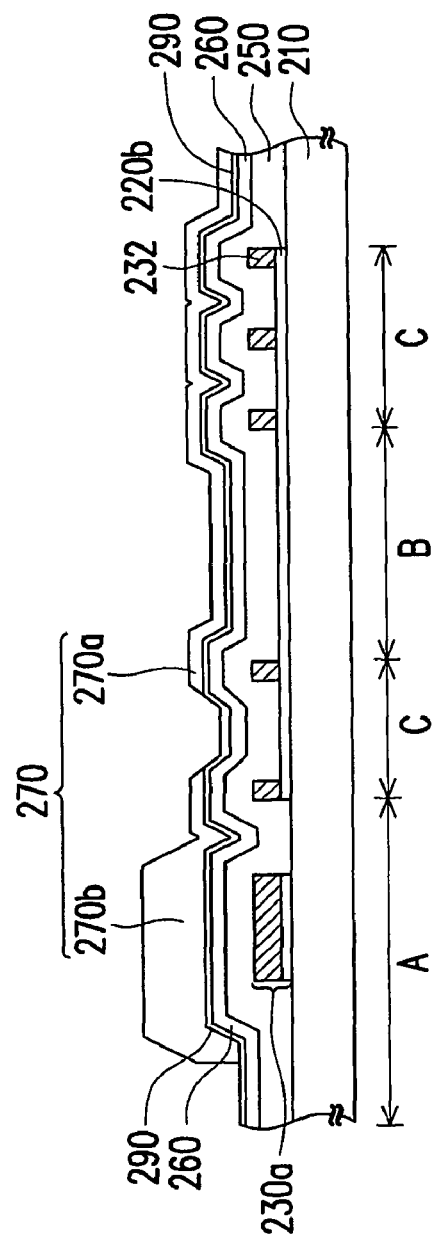

Referring to FIG. 3H, a second photoresist layer 270 is formed on the semiconductor layer 260, wherein the second photoresist layer 270 has a third part 270a and a fourth part 270b, and the thickness of the third part 270a and the thickness of the fourth part 270b are different. In detail, the second photoresist layer 270 can be formed with a half-tone mask process or a gray-tone mask process. In the present embodiment, the half-tone mask or the gray-tone mask has regions with two transmissivities, so that the second photoresist layer 270 may have the third part 270a and the fourth part 270b with different thicknesses. The second photoresist layer 270 is a positive photoresist. Certainly, the second photoresist layer 270 can also be a negative photoresist according to a design of the mask.

Referring to FIG. 3I, a portion of the semiconductor layer 260 and the gate insulating layer 250 is removed by using the second photoresist layer 270 as the mask, so as to form a contact opening P and expose a portion of the transparent conductive layer 220. In detail, a portion of the semiconductor layer 260 and the gate insulating layer 250 can be removed via a dry etching process or a wet etching process.

Figure 3K:
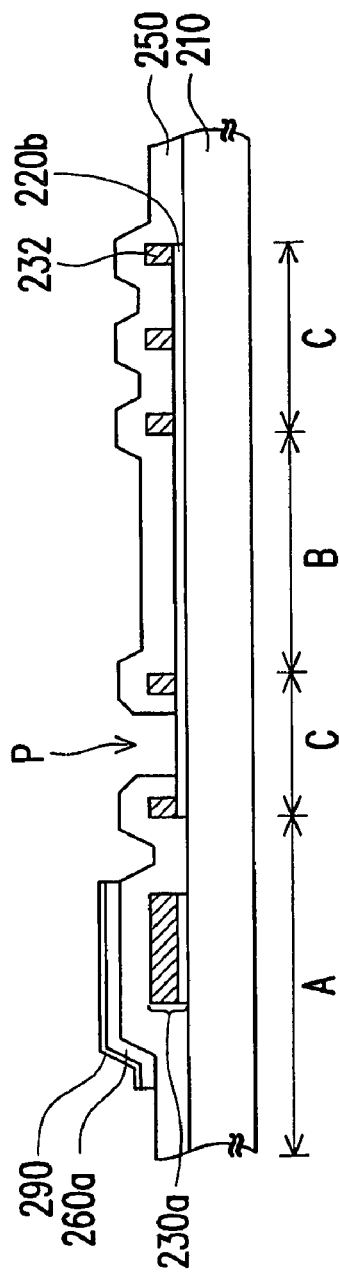

Referring to FIG. 3J, the third part 270a of the second photoresist layer 270 is removed to expose the semiconductor layer 260 located at the pixel reflective area C and the pixel transmissive area B. Next, the exposed semiconductor layer 260 is removed, and the remained semiconductor layer 260 located at the active device area A serves as a first channel layer 260a. In detail, the third part 260a of the second photoresist layer 270 can be removed via an ashing process, and then the exposed semiconductor layer 260 can be removed via a dry etching process, wherein the two processes can be sequentially performed within the same dry etching machine, so as to save a fabrication time thereof. Next, the fourth part 270b of the second photoresist layer 270 is removed, as shown in FIG. 3K. Until now, the second mask process is completed.

Figure 3L:
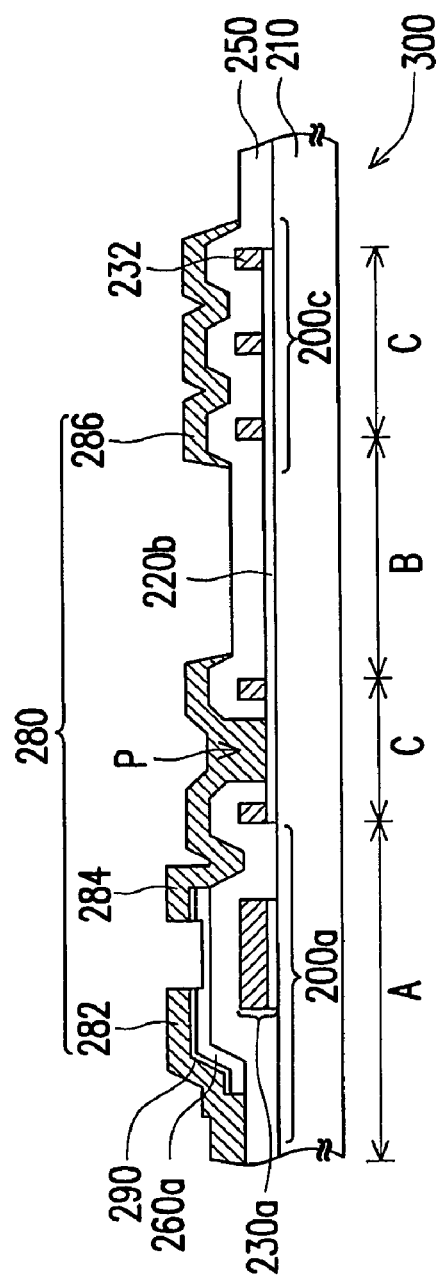

Referring to FIG. 3L, a patterned second conductive layer 280 including a source 282, a drain 284 and a reflective pattern 286 is formed on the substrate 210. The source 282 and the drain 284 are located above the channel layer 260a, and the drain 284 is electrically connected to the transparent conductive layer 220 via the contact opening P. Moreover, the reflective pattern 286 is located above the transparent conductive layer 220 of the pixel reflective area C. In detail, in the present embodiment, the patterned second conductive layer 280 not only functions as the source 282 and the drain 284, but is also formed in the pixel reflective area C to serve as the reflective pattern 286. Actually, the material of the patterned second conductive layer 280 can be Ag, Al or other conductive materials with good reflectivity and good conductivity. Moreover, since the ohmic contact layer 290 still exists between the source 282 and the drain 284, after the patterned second conductive layer 280 is formed, the patterned second conductive layer 280 is taken as the mask to remove the ohmic contact layer 290 located between the source 282 and the drain 284. Moreover, in another embodiment, after the step shown in FIG. 3L, an insulating layer (not shown) can be selectively formed to cover the active device area A, especially to cover the channel layer 260a exposed between the source 282 and the drain 284.

It should be noted that in the present embodiment, the pixel reflective area C has a plurality of the bumps 232 formed by the first conductive layer 230. Therefore, the gate insulating layer 250 and the reflective pattern 286 in the pixel reflective area C may have an uneven surface due to the bumps 232. By such means, the reflectivity of the pixel reflective area C can be improved, so as to improve a utilization rate of reflected lights.

In summary, according to the steps shown in FIG. 3A to FIG. 3L, the transflective pixel structure 300 with a preferred reflectivity can be fabricated. Referring to FIG. 3K, compared to the pixel structure 200 of the first embodiment, the pixel structure 300 includes a plurality of the bumps 232 disposed between the transparent pixel electrode 220b and the reflective pixel electrode 200c, so that the surface of the reflective pixel electrode 200c may have a plurality of the bumps, and therefore the reflectivity of the pixel reflective area C can be improved, so as to improve a utilization rate of external lights. Moreover, in another embodiment, the transflective pixel structure further includes an insulating layer (not shown) covering the active device area A, especially covering the channel layer 260a exposed between the source 282 and the drain 284.

In summary, the method of the present invention for fabricating the transflective pixel structure, and the pixel structure thereof have at least the following advantages:

In the present invention, the transparent conductive layer and the first conductive layer are disposed on the surface of the substrate, and by utilizing the first photoresist layer with different thicknesses, only one mask process is required for patterning the transparent conductive layer and the first conductive layer. Moreover, only one mask process is required for patterning the gate insulating layer and the channel layer, by which one mask process is further reduced, which avails reduction of the fabrication time and the fabrication cost. Therefore, the production yield can be improved.

It should be noted that the patterned second conductive layer is utilized as the reflective pattern of the transflective pixel structure, so that additional forming of the reflective layer on the pixel structure is unnecessary. Therefore, not only the fabrication cost and time can be saved, but also one mask process is further reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a pixel structure, comprising:
providing a substrate comprising an active device area, a pixel transmissive area and a pixel reflective area;
sequentially forming a transparent conductive layer and a first conductive layer on the substrate;
forming a first photoresist layer on the first conductive layer, wherein the first photoresist layer has a first part and a second part, and the thickness of the first part and the thickness of the second part are different;
removing a portion of the first conductive layer and the transparent conductive layer by using the first photoresist layer as a mask, so as to form a composite gate in the active device area;
removing the first part of the first photoresist layer to expose the first conductive layer located at the pixel transmissive area and a portion or all of the first conductive layer located at the pixel reflective area;
removing the exposed first conductive layer by using the second part of the first photoresist layer as a mask, so as to expose the transparent conductive layer in the pixel transmissive area and a portion or all of the transparent conductive layer in the pixel reflective area;

removing the second part of the first photoresist layer;

sequentially forming a gate insulating layer and a semiconductor layer on the substrate;

forming a second photoresist layer on the semiconductor layer, wherein the second photoresist layer has a third part and a fourth part, and the thickness of the third part and the thickness the fourth part are different;

removing a portion of the semiconductor layer and the gate insulating layer by using the second photoresist layer as a mask, so as to form a contact opening for exposing a portion of the transparent conductive layer;

removing the third part of the second photoresist layer to expose the semiconductor layer in the pixel reflective area and the pixel transmissive area;

removing the exposed semiconductor layer, and remaining the semiconductor layer in the active device area to serve as a channel layer;

removing the fourth part of the second photoresist layer; and forming a patterned second conductive layer comprising a source, a drain and a reflective pattern on the substrate, wherein the source and the drain are located above the channel layer, and the reflective pattern is located above the transparent conductive layer in the pixel reflective area, wherein in the step of removing the exposed first conductive layer by using the second part of the first photoresist layer as the mask, the transparent conductive layer in the pixel transmissive area and a portion of the transparent conductive layer in the pixel reflective area are exposed, and the remained first conductive layer in the pixel reflective area forms a plurality of bumps.

2. The method for fabricating a pixel structure as claimed in claim 1, wherein the first photoresist layer and the second photoresist layer are formed with a half-tone mask process or a gray-tone mask process.

3. The method for fabricating a pixel structure as claimed in claim 1, wherein the first photoresist layer and the second photoresist layer comprise a positive photoresist.

4. The method for fabricating a pixel structure as claimed in claim 1, wherein the first part of the first photoresist layer and the third part of the second photoresist layer are removed with an ashing process.

5. The method for fabricating a pixel structure as claimed in claim 1, wherein the method of forming the transparent conductive layer comprises forming an indium tin oxide (ITO) layer, an indium zinc oxide (IZO) layer or an aluminium zinc oxide (AZO) layer via a sputtering process.

6. The method for fabricating a pixel structure as claimed in claim 1, further comprising forming an ohmic contact layer on the semiconductor layer; and removing the ohmic contact layer located between the source and the drain by using the patterned second conductive layer as a mask.

* * * * *